United States Patent
Ishikawa et al.

(10) Patent No.: US 9,349,569 B2
(45) Date of Patent: May 24, 2016

(54) CHARGED PARTICLE BEAM SYSTEM

(71) Applicant: JEOL Ltd., Tokyo (JP)

(72) Inventors: Takaki Ishikawa, Tokyo (JP); Kazunori Somehara, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/619,134

(22) Filed: Feb. 11, 2015

(65) Prior Publication Data

US 2015/0255245 A1    Sep. 10, 2015

(30) Foreign Application Priority Data

Feb. 13, 2014   (JP) .................................. 2014-25292

(51) Int. Cl.
*H01J 37/20*    (2006.01)
*H01J 37/26*    (2006.01)
*H01J 37/147*   (2006.01)

(52) U.S. Cl.
CPC ............... *H01J 37/20* (2013.01); *H01J 37/147* (2013.01); *H01J 37/26* (2013.01)

(58) Field of Classification Search
USPC ............ 250/306, 307, 309, 310, 311, 440.11, 250/441.11, 442.11, 443.1
See application file for complete search history.

(56) References Cited

U.S. PATENT DOCUMENTS

| 2004/0106862 A1* | 6/2004 | Kohama | ............... 600/407 |
| 2013/0097740 A1* | 4/2013 | Mack | ............... G01Q 60/10 850/26 |

FOREIGN PATENT DOCUMENTS

JP    2010157491 A    7/2010

* cited by examiner

*Primary Examiner* — Nicole Ippolito
(74) *Attorney, Agent, or Firm* — The Webb Law Firm

(57) ABSTRACT

A charged particle beam system capable of suppressing drift of a functional component used in association with a sample is offered. The charged particle beam system (1000) images the sample (S) by irradiating the sample with a charged particle beam (EB). The system includes the functional component (such as a sample holder (20)), drive portions (40, 50) for moving the sample holder (20), and a controller (60) for controlling the drive portions (40, 50). The controller (60) controls the drive portions (40, 50) to vibrate the sample holder (20) such that its amplitude is driven to decrease with time.

11 Claims, 12 Drawing Sheets

Fig. 2

CHARGED PARTICLE BEAM SYSTEM

BACKGROUND OF THE INVENTION

1. Field of the Invention

The present invention relates to a charged particle beam system.

2. Description of Related Art

In a charged particle beam system such as a transmission electron microscope (TEM) or a scanning electron microscope (SEM), a sample is required to be placed in position with high positional accuracy. The positional accuracy referred to herein is a restraining capability of maintaining a sample at rest after an operation for placing the sample in position is complete. If the sample keeps moving unintentionally after the positioning operation is complete, the sample is said to drift.

For example, JP-A-2010-157491 discloses an object positioning device for use with a charged particle beam system such as a transmission electron microscope. In this disclosed JP-A-2010-157491, when a sample is introduced into the electron optical column of the microscope or when the sample stage is moved a great distance to search for a desired field of view for observation, the sample drive unit deforms elastically. As a result, a large stress is introduced as a spring component. When this stress is relieved by the action of a damper component also possessed by the drive unit, the drive unit itself moves, causing the sample to drift. This deteriorates the restraining capability.

FIG. 10 shows a model M for illustrating the drift. If this model M is compressed by applying a certain force across the model M, a damper D1 cannot follow instantaneous movements. Therefore, only a spring S1 contracts. The damper D1 is then pushed in with the elapse of time and the spring S1 begins to be restored to its original shape. When the damper D1 stretches to some extent, the stretching force of the spring is lost, and the progress of the stretch comes to a stop.

If the model M is applied to the sample stage of the transmission electron microscope, then a deformation of an O-ring used for vacuum sealing purposes, a deformation of a resinous part used for electrical insulation, and grease applied to various contact surfaces correspond to damper components. An elastic deformation of the drive unit corresponds to a spring component. The O-ring acts as a damper component and also as a spring component because the rubber that expands and contracts causes an elastic deformation.

FIG. 11 shows one example of damper component. Cross sections of O-rings are schematically shown in FIG. 11. Damper components are now described while taking O-rings as examples.

The drive unit operates while producing a magnitude of elastic deformation corresponding to frictional force produced during the operation. After the drive unit has come to a halt, the elastic deformation remains as a spring component (stress). After the operation of the drive unit has stopped, the stress in the drive unit is relieved with time because of the damper effect of the O-ring. At this time, the damper D1 shown in FIG. 10 is pushed in, resulting in a variation in the shape of the O-ring. According to the magnitude of the stress introduced during operation, the shape of the cross section of the O-ring varies in the direction indicated by the arrows in FIG. 11. As a result, the sample drifts, i.e., the sample moves. When the stress in the drive unit disappears or when the stress in the drive unit is balanced by another stress counteracting the former stress, the drift comes to a stop.

A transmission electron microscope has high resolution. Subjects to be observed have sizes on the order of nanometers. In recent years, making observations on an atomic scale using a transmission electron microscope has been increasingly carried out. Therefore, the amount of drift that the sample is allowed to exhibit during imaging is on a subatomic level. In order to prevent deterioration of the spatial resolution, the exposure time is restricted by the speed at which the sample drifts and by the minimum pixel size of the detector. If the drift is small, the shooting time can be prolonged and so the S/N can be improved while retaining the resolution of the taken image.

Furthermore, in transmission electron microscopy, energy-dispersive X-ray spectrometry for performing elemental analysis using information about X-rays produced from a sample or electron energy loss spectroscopy for analyzing elements constituting a substance or its electronic structure from energies lost from impinging electrons by a sample is often performed as well as imaging. For such spectrometry or spectroscopy, data need to be collected for a much longer time than where an image is taken. If the sample drifts during data acquisition, the spatial resolution will be directly impaired. Therefore, if the sample can be kept at rest without drifting after the sample is placed in position, then high spatial resolution and high S/N can be accomplished.

One conceivable method of preventing drifting is to cancel drift by movement of the sample. In particular, the sample is once brought onto a target field of view. Then, the sample is intentionally made to pass over the target field of view. The sample is then returned onto the target field of view. That is, a negative amount of drift is introduced, thereby canceling the true drift.

The drift speed and the stress in the drive unit causing the drift decrease with time but do not vary linearly with time. The degrees of variations change depending on the magnitude of the stress introduced into the drive unit and on the damper component. The magnitude of the stress introduced into the drive unit is affected by the damper component such as grease and depends on the amount of motion made until the sample reaches the target field of view, on the moving speed, and on the hysteresis.

FIG. 12 is a graph in which drift speed is plotted against elapsed time for various amounts of motion (100 μm, 10 μm, 5 μm, and 1 μm) made prior to positioning. The drift speed decreases exponentially with time. Furthermore, the amount of drift decreases with reducing the amount of motion made prior to positioning. As can be seen from FIG. 12, when the amount of motion is different, the curve of the graph is different in tilt. Therefore, it is difficult to cancel the drift by introducing a negative amount of drift.

Furthermore, the frictional forces occurring on individual sample stages are not uniform. The stress varies depending on the frictional force. In addition, individual dampers vary among each other. Therefore, behaviors of drift vary in a complex manner. Especially, an O-ring has both a spring component and a damper component and further complicates the phenomenon.

Accordingly, it is very difficult to intentionally introduce a negative amount of drift so as to cancel out the true drift as described previously.

SUMMARY OF THE INVENTION

In view of the foregoing problems, the present invention has been made. One object associated with some aspects of the present invention is to provide a charged particle beam system capable of suppressing drift of a functional component used in association with a sample.

(1) A charged particle beam system associated with the present invention is adapted to image a sample for observing it by irradiating the sample with a charged particle beam. The charged particle beam system has a movable and vibratable functional component used in association with the sample, a mechanical drive for moving the functional component, and a controller for controlling the mechanical drive. The controller controls the mechanical drive to vibrate the functional component such that its amplitude is driven to decrease with time.

In this charged particle beam system, drift of the functional component can be suppressed as described later. Therefore, the shooting time can be increased. Also, the spatial resolution and S/N of the produced image can be improved. Additionally, the analysis time can be increased. Hence, the spatial resolution and the S/N in making analysis can be improved.

(2) In one feature of this charged particle beam system, there is further provided a support portion by which the functional component is movably supported.

In this charged particle beam system, drift of the functional component can be suppressed.

(3) In one feature of the charged particle beam system described immediately above, an O-ring in contact with the support portion is fitted over the functional component. The mechanical drive may move the functional component along a first axis. The controller may control the mechanical drive to vibrate the functional component along the first axis.

In this charged particle beam system, drift of the functional component along the first axis can be suppressed.

(4) In a further feature of this charged particle beam system, the functional component may be supported by the support portion such that a longitudinal direction of the functional component is parallel to the first axis.

In this charged particle beam system, drift of the functional component can be suppressed.

(5) In a further feature of this charged particle beam system, the mechanical drive may be further operative to move the functional component along a second axis perpendicular to the first axis. The controller may control the mechanical drive to vibrate the functional component along the second axis.

In this charged particle beam system, drift of the functional component along the second axis can be suppressed.

(6) In an additional feature of this charged particle beam system, the controller may control the mechanical drive such that said functional component is vibrated about a given position and then brought to a stop at the given position.

In this charged particle beam system, imaging or analysis can be performed in a desired field of view while drift is suppressed.

(7) In a still other feature of this charged particle beam system, the functional component may be a sample holder that holds the sample.

In this charged particle beam system, drift of the sample can be suppressed. Therefore, the shooting time can be increased. The image spatial resolution and S/N can be improved. Furthermore, the analysis time is prolonged. This leads to improvements in spatial resolution and S/N in making analysis.

(8) In a yet other feature of this charged particle beam system, the controller includes an image analysis section for obtaining information about positional deviation of the functional component, based on a first image obtained before the functional component is vibrated under control of the controller and on a second image obtained after the functional component is vibrated under control of the controller. The controller may control the mechanical drive based on the information about the positional deviation of the functional component obtained by the image analysis section to move the functional component into the position where the first image was obtained.

In this charged particle beam system, if the functional component is vibrated under control of the controller, the functional component can be precisely returned to its position assumed before the functional component is vibrated.

(9) In a still further feature of this charged particle beam system, there are further provided a charged particle beam source producing the charged particle beam and a beam blanker for cutting off the charged particle beam emitted from the charged particle beam source while the functional component is being vibrated under control of the controller.

In this charged particle beam system, damage to the sample by being irradiated with the charged particle beam can be reduced.

(10) In a still further feature of this charged particle beam system, there may be further provided a functional component detector for detecting that the functional component has been introduced in a sample chamber. If the functional component is detected to have been introduced in the sample chamber by the functional component detector, the controller may control the mechanical drive to vibrate the functional component such that its amplitude decreases with time.

In this charged particle beam system, stress produced when the functional component is introduced into the sample chamber can be relieved. Therefore, in this charged particle beam system, drift of the functional component can be suppressed.

(11) In a yet other feature of this charged particle beam system, the controller may determine the magnitude of the amplitude of the vibrations of the functional component according to a distance traveled by the functional component.

In this charged particle beam system, drift of the functional component can be suppressed efficiently.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. First Embodiment

1.1. Configuration of Charged Particle Beam System

Figure 1:
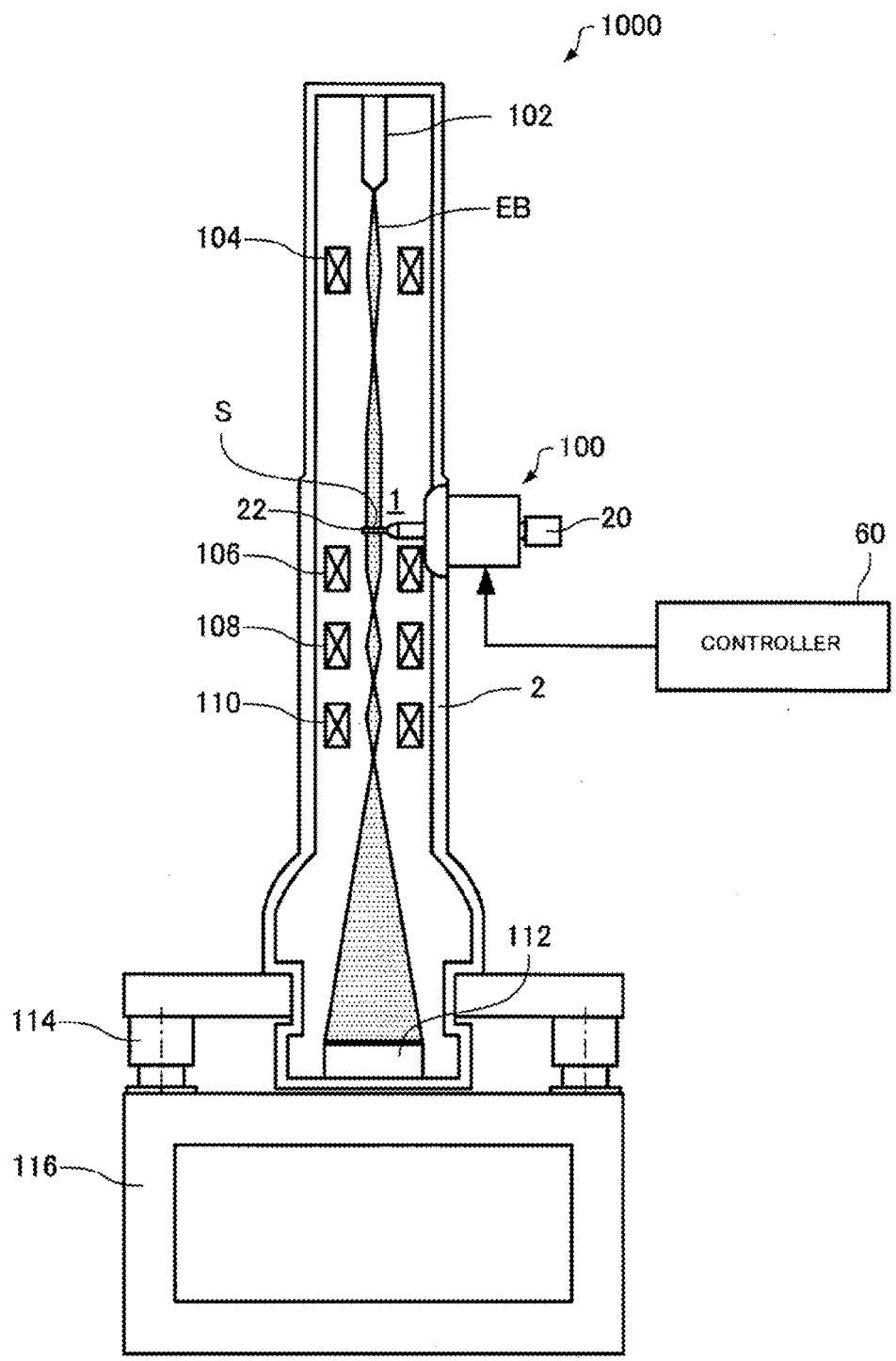
FIG. 1 is a schematic front elevation, partly in block form, of a charged particle beam system associated with a first embodiment of the present invention.

A charged particle beam system associated with a first embodiment of the present invention is first described by referring to FIG. 1, where the system is schematically shown and generally indicated by reference numeral 1000.

As shown in FIG. 1, the charged particle beam system 1000 includes an electron beam source (charged particle beam source) 102, condenser lenses 104, an objective lens 106, an intermediate lens 108, a projector lens 110, an imager 112, and a positioning device 100.

It is now assumed that the charged particle beam system 1000 is a transmission electron microscope (TEM). FIG. 1 shows a state in which a sample holder 20 has been inserted in a sample chamber 1. Also in FIG. 1, the positioning device 100 is shown in simplified form for the sake of convenience.

The electron beam source 102 emits an electron beam EB by accelerating electrons by an anode, the electrons being released from a cathode. No restrictions are imposed on the electron gun used as the electron beam source 102. For example, a thermionic electron gun, a thermal field-emission electron gun, a cold field emission gun, or other electron, gun can be used.

The condenser lenses 104 are disposed behind the electron beam source 102 (i.e., on the downstream side of the source 102 as viewed along the electron beam EB). The condenser lenses 104 are used to focus the electron beam EB generated by the electron beam source 102 onto a sample S. The condenser lenses 104 may be singular or plural in number.

The objective lens 106 is disposed behind the condenser lenses 104. The objective lens 106 is an initial stage of lens for focusing the electron beam EB transmitted through the sample S.

The objective lens 106 has an upper polepiece and a lower polepiece (not shown). The objective lens 106 produces a magnetic field between the upper and lower polepieces to focus the electron beam EB. The sample S is positioned between the upper and lower polepieces by the sample holder 20.

The intermediate lens 108 is disposed behind the objective lens 106. The projector lens 110 is disposed behind the intermediate lens 108. The intermediate lens 108 and projector lens 110 cooperate to further magnify the image focused by the objective lens 106 and to focus the magnified image onto the imager 112.

The imager 112 that is a digital camera, for example, captures the image (electron microscope image or electron diffraction pattern) focused by the projector lens 110. The imager 112 outputs information about the captured electron microscope image or electron diffraction pattern. The information from the imager 112 indicative of the electron microscope image or electron diffraction pattern is processed by an image processor (not shown) and displayed on a display device (not shown) which is a CRT, an LCD, a touch panel display, or the like.

In the illustrated example, the electron optical column of the charged particle beam system 1000 is mounted on a pedestal 116 via vibration isolators 114.

The positioning device 100 is operative to place the sample holder 20 in position, whereby the sample S can be placed in position in the sample chamber 1. That is, the positioning device 100 can bring the sample S into position or bring the sample to a stop in the sample chamber 1 by moving or stopping the sample holder 20.

Figure 2:
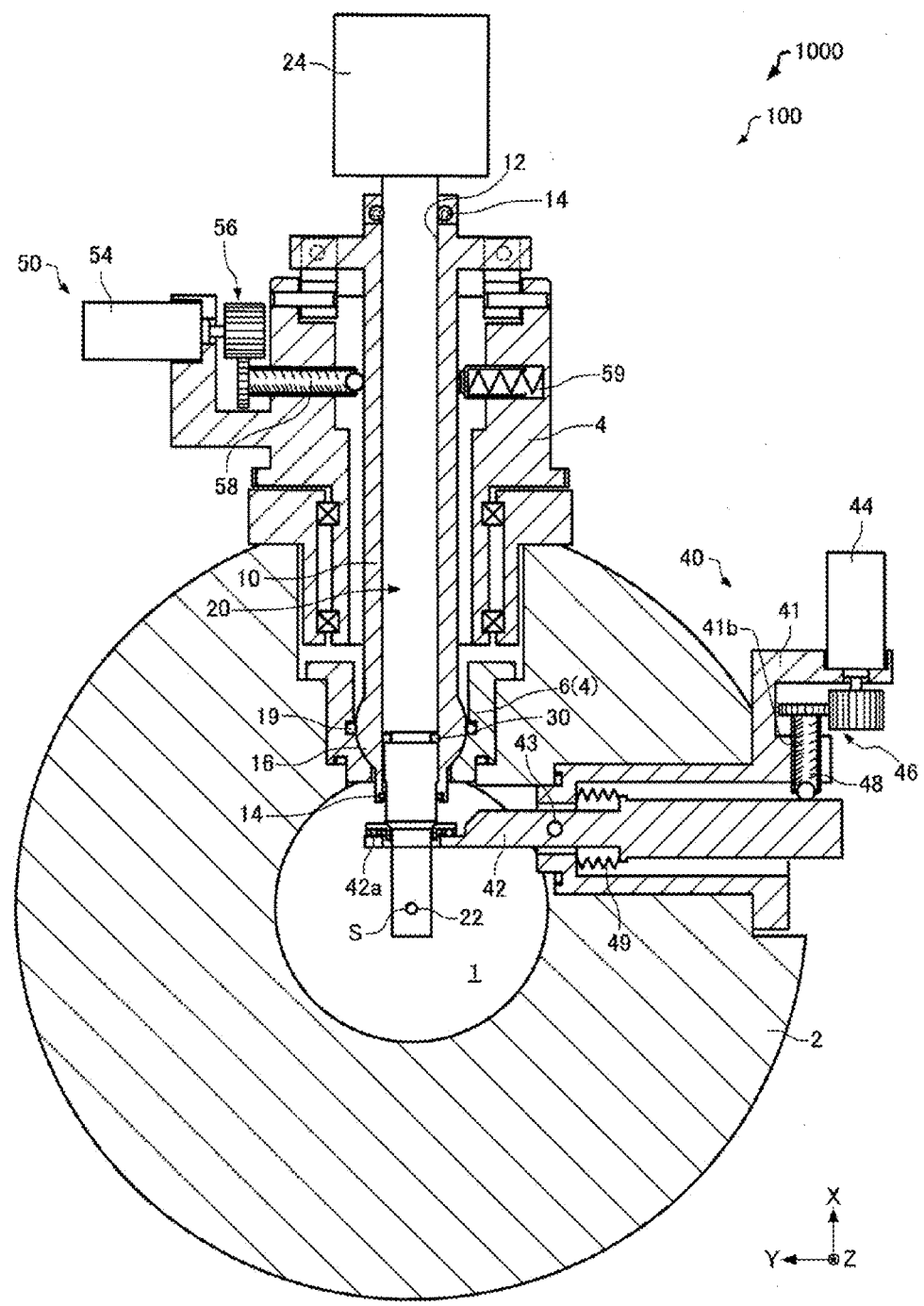
FIG. 2 is a schematic view of main portions of the charged particle beam system shown in FIG. 1.

Main portions of the charged particle beam system 1000 are schematically shown in FIG. 2, where X-, Y-, and Z-axes are shown as three mutually perpendicular axes. In the illustrated example, an electron beam (not shown) passing through the sample chamber 1 travels in the direction of the Z-axis.

As shown in FIG. 2, the positioning device 100 has a shifter 10 acting as a support portion, the sample holder 20 (functional component), an O-ring 30, and a mechanical drive. This mechanical drive includes an X drive portion 40 and a Y drive portion 50. Furthermore, the positioning device 100 includes a controller 60 shown in FIG. 1.

FIG. 2 shows the manner in which the positioning device 100 is in operation. That is, the sample holder 20 has been mounted on the support portion 10. The operation of the positioning device 100 is described in further detail below.

The sample chamber 1 is surrounded by the inner wall 2 of the electron optical column as shown in FIG. 2. The support portion 10 is held by a holding member 4 extending through the inner wall 2. The support portion 10 has a hole 12 in communication with the sample chamber 1. The sample holder 20 is movably inserted in the hole 12. The O-ring 30 is fitted over the sample holder 20 to provide a hermetical seal between the sample holder 20 and the support portion 10. The X drive portion 40 can move the sample holder 20 in the direction of the X-axis. The Y drive portion 50 can move a front end portion of the sample holder 20 in the direction of the Y-axis by rotating the support portion 10.

The interior of the sample chamber 1 can be maintained at subatmospheric pressure by evacuating the interior by a well-known vacuum pump (not shown). The sample S is introduced into the sample chamber 1 by the sample holder 20. In the sample chamber 1, the sample S is irradiated with the electron beam.

The holding member 4 is formed to extend through the inner wall 2 as described previously. The support portion 10 is inserted in the holding member 4. Spherical surface bearings 6 are mounted on the sample chamber side of the holding member 4. The spherical surface bearings 6 have their respective spherical inner surfaces.

The support portion 10 is a hollow and cylindrical member and has the hole 12 in communication with the sample chamber 1. In the illustrated example, the hole 12 extends in the direction of the X-axis. For example, the hole 12 is solid and cylindrically shaped and has a central axis (not shown) parallel to the X-axis. The sample holder 20 is loaded in the hole 12. As a result, translations of the sample holder 20 in the directions of the Y- and Z-axes are restricted. The holder 20 is allowed to move linearly in the direction of the X-axis.

Bearings 14 supporting the sample holder 20 are mounted inside the support portion 10. In the illustrated example, the bearings 14 are mounted at both ends of the support portion 10 which are close to both openings of the hole 12. The bearings 14 can smoothen movement of the sample holder 20 in the direction of the X-axis. The positions and number of the bearings 14 are not restricted to the example shown in FIG. 2.

Any positions and number may be adopted as long as the sample holder 20 can be supported so as to be movable linearly.

The support portion 10 has a spherical surface portion 16 at its end closer to the sample chamber 1. The surface of the spherical surface portion 16 is shaped as a spherical surface centered at the central axis of the hole 12. The spherical surface portion 16 is supported by the spherical surface bearings 6. The inner surfaces of the spherical surface bearings 6 are so formed as to contact the surface of the spherical surface portion 16. Consequently, the spherical surface portion 16 is slidably supported by the spherical surface bearings 6. Thus, the support portion 10 can rotate about the center of the spherical surface portion 16. An O-ring 19 is mounted between the spherical surface portion 16 and the spherical surface bearings 6 to hermetically seal the sample chamber 1.

The sample holder 20 is a cylindrical rod-like member and has a front end portion in which a sample holding portion 22 for holding the sample S is formed. The sample holding portion 22 may secure the sample S by tightening screws (not shown) or holding down the sample S by an annular spring. The sample holder 20 has a widened rear end portion 24 that is greater in diameter than the hole 12 in the support portion 10.

The O-ring 30 is fitted over the sample holder 20. In the illustrated example, a groove is formed in the outer surface of the sample holder 20. The O-ring 30 is mounted in this groove. The O-ring 30 is in contact with the inner surface of the support portion 10 to provide a hermetic seal between the support portion 10 and the sample holder 20. As the sample holder 20 moves, the O-ring 30 slides within the hole 12 formed in the support portion 10. The O-ring 30 is made of a viscoelastic material such as rubber.

The sample holder 20 is movably mounted in the hole 12 formed in the support portion 10. The sample holder 20 is slidably supported by the support portion 10 such that the longitudinal direction of the holder 20 is parallel to the X-axis. As shown in FIG. 2, the sample holder 20 is disposed to extend from the evacuated interior of the sample chamber 1 to the outside that is on the atmospheric side.

In the illustrated example, the mechanical drive of the positioning device 100 is configured including the X drive portion 40 and the Y drive portion 50. These drive portions 40 and 50 move and stop the sample holder 20. Thus, the sample S can be brought into a desired position in the sample chamber 1 and brought to a stop.

The X drive portion 40 moves at least a part of the sample holder 20 in the direction of the X-axis. In the illustrated example, the X drive portion 40 moves at least the sample holding portion 22 of the sample holder 20 in the direction of the X-axis. As shown in FIG. 2, the X drive portion 40 is configured including a lever 42, an X motor 44, a spur gear pair 46, and an X feed screw 48.

The lever 42 prevents the sample holder 20 from being pulled in due to atmospheric pressure and supports the holder 20 in the direction of the X-axis. The lever 42 is rotatable about a shaft 43. A bearing 42a is mounted at the end of the lever 42 that is closer to the sample chamber 1. The lever 42 supports the sample holder 20 via the bearing 42a capable of rolling within the Y-Z plane. This smoothens motion of the sample holder 20 (especially, the sample holding portion 22) in the direction of the Y-axis as described later. The X feed screw 48 is in abutting engagement with the end of the lever 42 facing away from the sample chamber 1.

The X feed screw 48 is moved linearly in the direction of the X-axis by rotation of the X motor 44. This in turn rotates the lever 42 about the shaft 43 to thereby move the sample holder 20 linearly in the direction of the X-axis. The spur gear pair 46 transmits the rotation of the X motor 44 to the X feed screw 48. A bellows 49 can smoothen the movement of the lever 42 while maintaining the interior of the sample chamber 1 at subatmospheric pressure.

In the charged particle beam system 1000, the X motor 44 is supported by an X drive portion supporting block 41 inserted in the inner wall 2. The block 41 is provided with a threaded hole 41b with which the X feed screw 48 mates. The X feed screw 48 extends through the threaded hole 41b.

The Y drive portion 50 moves at least a part of the sample holder 20 in the direction of the Y-axis. In the illustrated example, the Y drive portion 50 moves at least the sample holding portion 22 of the sample holder 20 in the direction of the Y-axis. The Y drive portion 50 is configured including a Y motor 54, a spur gear pair 56, a Y feed screw 58, and a return spring 59.

The front end of the Y feed screw 58 is in contact with the outer surface of the support portion 10 on the positive side of the Y-axis as shown in FIG. 2. The return spring 59 is mounted on the outer surface of the support portion 10 on the negative side of the Y-axis to bias the support portion 10 in the positive direction of the Y-axis.

The Y feed screw 58 is moved linearly in the direction of the Y-axis by rotation of the Y motor 54. This in turn rotates the support portion 10 about the spherical surface portion 16. Consequently, the front end (i.e., the sample holding portion 22) of the sample holder 20 can be moved linearly in the direction of the Y-axis. The spur gear pair 56 transmits the rotation of the Y motor 54 to the Y feed screw 58.

The mechanical drive of the positioning device 100 may further include a Z drive portion (not shown) for moving the front end (i.e., the sample holding portion 22) of the sample holder 20 in the direction of the Z-axis. The Z drive portion may be similar in configuration to the Y drive portion 50. In addition, the positioning device 100 may include a tilting mechanism (not shown) for tilting the sample S about the X-axis.

The controller 60 (see FIG. 1) controls the X and Y drive portions 40 and 50. In the example of FIG. 2, the drive portions 40 and 50 are operated by feeding control signals from the controller 60 to the X motor 44 and Y motor 54.

The controller 60 may be made of dedicated circuitry and perform control operations (described later). Furthermore, the controller 60 may be operated as a computer by executing control programs stored in a storage device (such as a ROM (read-only memory) or a RAM (random access memory)) using a CPU (central processing unit), and this computer may perform the control operations (described later).

The controller 60 moves the sample holding portion 22 to a target position, for example, by storing a target position (target coordinates) for the sample holding portion 22 and controlling the drive portions 40 and 50.

The controller 60 controls the X drive portion 40 to vibrate the sample holder 20 along the X-axis such that the amplitude decreases with time. For example, the controller 60 controls the X drive portion 40 to move the sample holder 20 in the positive direction of the X-axis and in the negative direction of the X-axis repeatedly about a given position such that the amount of motion decreases in steps and to bring the sample holder 20 to a stop at the given position.

Furthermore, the controller 60 controls the Y drive portion 50 to vibrate the sample holder 20 along the Y-axis such that the amplitude decreases with time. For example, the controller 60 controls the Y drive portion 50 to move the sample holder 20 in the positive and negative directions of the Y-axis repeatedly about a given position such that the amount of motion decreases in steps and to bring the sample holder 20 to a stop at the given position.

When a switch (not shown) mounted on the positioning device 100 is depressed, the controller 60 starts a control sequence for controlling the drive portions 40 and 50 and vibrating the sample holder 20.

Figure 3:
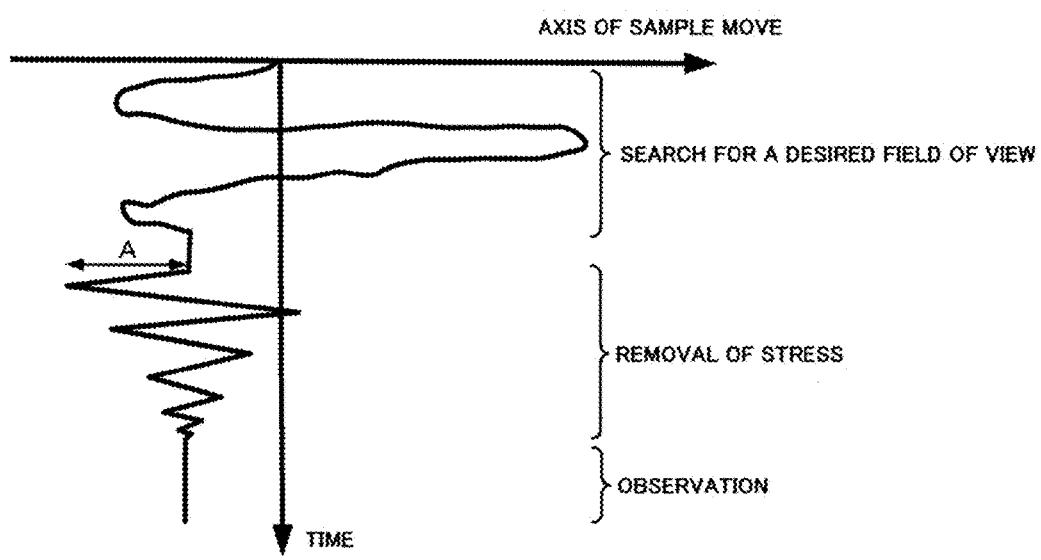
FIG. 3 is a chart illustrating an example of the operation of the controller of the charged particle beam system shown in FIG. 1.

FIG. 3 is a chart illustrating one example of the operation of the controller 60. In FIG. 3, the horizontal axis indicates the X-axis or Y-axis along which the sample holder (and the sample S) moves. The vertical axis indicates time.

When a desired field of view is searched for, a large stress is introduced. In response to this, the controller 60 vibrates the sample holder 20 about the current position so as to remove the stress. In order to completely remove a large stress, it is necessary to move the sample holder 20 to some large extent at the beginning.

The stress induced when the drive portions 40 and 50 move the sample holder 20 has a maximum value. That is, if the drive portions 40 and 50 move the sample holder 20 over large distances, the induced stress does not exceed the maximum stress. Therefore, the controller 60 first moves the sample holder 20 over a minimum distance at which the maximum stress can be induced. That is, in the controller 60, an initial amplitude A shown in FIG. 3 is set to the minimum distance at which the maximum stress can be introduced.

During this process for moving the sample holder 20 at the initial amplitude A, a new stress is introduced instead of removing the initial stress. The sample chamber is moved over a distance reduced by an increment compared with the previous time to remove the stress. Simultaneously with the removal, a new stress is introduced again but this stress is reduced as compared with the previous time because the distance traveled is reduced. In this way, the controller 60 moves the sample holder 20 at the initial amplitude A and then moves the sample holder 20 over a distance which is smaller than the immediately previously used distance and which permits removal of the stress introduced by the previous movement. Decreases in the distance traveled by the sample holder 20 and in the stress are canceled by a decrease in the amount of slippage on a slipping surface such as on an O-ring. The controller 60 repeats this sequence of operations. Finally, the controller 60 reduces the distance traveled down to a minimum amount of motion that can be controlled by the controller 60 and brings the holder to a stop. As a result, the stress decreases to an infinitely small amount. Hence, the drift can be reduced.

The removal of the stress is affected only a little by the speed at which the sample holder 20 is moved. Therefore, no restriction is placed on the speed at which the sample holder 20 is moved under control of the controller 60.

If it is impossible to vibrate the sample holder 20 at the initial amplitude A, e.g., if the distance between the present position of the sample holder 20 and a critical position at which the sample holder 20 can be moved by the drive portions 40 and 50 is smaller than the initial amplitude A, the controller 60 displays an error message on a display device and does not perform the control sequence for vibrating the sample holder 20.

When the sample holder 20 cannot be vibrated at the initial amplitude A, the controller 60 may reduce the value of the initial amplitude A and vibrate the sample holder 20. For example, the value of the initial value A may be set to the distance between the present position of the sample holder 20 and a critical position at which the sample holder 20 can be moved by the drive portions 40 and 50.

1.2. Operation of Charged Particle Beam System

The operation of the charged particle beam system 1000 associated with the first embodiment is next described. An operation for suppressing drift of the sample holder 20 during observation of the sample S is described as one example of the operation of the charged particle beam system 1000 by referring to FIGS. 1-3.

In order for a user to search for a desired field of view, the sample S is moved. For example, the user moves the sample holder 20 to move the sample S by operating the drive portions 40 and 50 via the controller 60.

After a desired field of view has been determined, the user brings the sample holder 20 (and the sample S) to a stop and depresses the switch (not shown) on the positioning device 100. The controller 60 initiates the control sequence for vibrating the sample holder 20.

The controller 60 first controls the X drive portion 40 to vibrate the sample holder 20 about the initial field of view along the X-axis such that the amplitude is driven to decrease with time.

In particular, the controller 60 controls the X drive portion 40 to move the sample holder 20 over a large distance in the negative direction of the X-axis such that large stress introduced by the search for a desired field of view is removed. Then, the sample holder is moved over the same distance in the positive direction of the X-axis, and the current field of view is returned to the initial field of view. That is, the sample holder 20 makes a first reciprocating motion. At this time, the stress introduced by the search for a desired field of view is removed. However, a new stress is induced during movement for returning to the initial field of view.

Then, the controller 60 controls the X drive portion 40 to move the sample holder in the positive direction of the X-axis (i.e., opposite to the direction taken by the first reciprocating motion) over a distance smaller than the previous time. Then, the sample holder is returned over the same distance in the negative direction of the X-axis and the current field of view is returned to the initial field of view. This constitutes a second reciprocating motion. The distance traveled at this time is so large that the stress introduced by the first reciprocating motion can be removed. Also, at this time, a new stress is induced during the movement for returning to the initial field of view instead of removal of the stress introduced by the first reciprocating motion. However, the stress is smaller in proportion to the decrease in the distance traveled. Decreases in the distance traveled and stress caused by the second reciprocating motion as compared with the first reciprocating motion are canceled by a decrease in the amount of slippage on slip surfaces such as the contact surfaces of an O-ring and resinous parts.

The controller 60 repeats the above-described operations and incrementally reduces the distance traveled down to a minimum distance that can be controlled by the controller 60. Then, the sample holder 20 is brought to a stop.

Then, the controller 60 controls the Y drive portion 50 to vibrate the sample holder 20 about the initial field of view along the Y-axis such that the amplitude decreases with time. The controller 60 controls the Y drive portion 50 in a manner similarly to the X drive portion 40. Then, the controller 60 terminates the control sequence.

As a result, the stresses induced in the O-ring 30 and in the drive portion 40, 50 can be reduced to infinitely small values.

In consequence, drift can be reduced. Then, the user can perform imaging and analysis in the desired field of view (initial field of view).

While there has been described a preferred form of the present invention in which the Y drive portion 50 is controlled to vibrate the sample holder 20 along the Y axis after the controller 60 controls the X drive portion 40 to vibrate the sample holder 20 along the X-axis, the controller 60 may control the X drive portion 40 to vibrate the sample holder 20 along the X-axis after causing the Y drive portion 50 to vibrate the sample holder 20 along the Y-axis. Furthermore, the controller 60 may control the X drive portion 40 and the Y drive portion 50 simultaneously to vibrate the sample holder 20 along the Y-axis while vibrating the holder along the X-axis.

Figure 4:
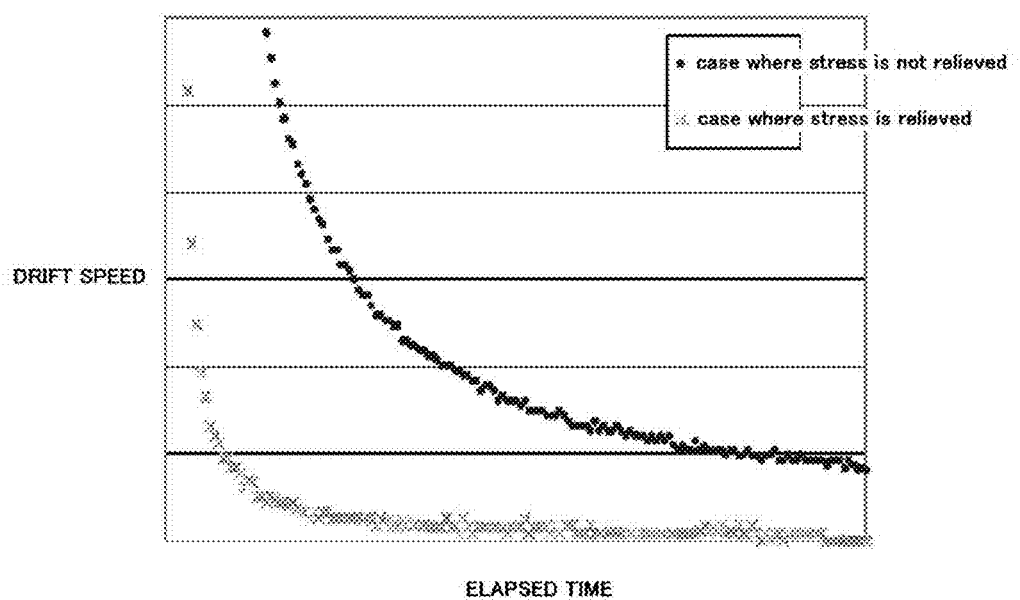
FIG. 4 is a graph showing variations in drift speed for a case where stress is relieved and for a case where stress is not relieved.

FIG. 4 is a graph showing timewise variations in drift speed for a case where stress is relieved by performing an operation for vibrating the sample holder and for a case where stress is not relieved. In the graph of FIG. 4, a case in which the controller 60 performs the aforementioned control sequence to vibrate the sample holder 20 for relieving stress is compared with a case in which the control sequence is not done such that stress is not relieved. It can be seen from this graph that drift is suppressed by the aforementioned control sequence executed by the controller 60 to vibrate the sample holder 20.

The charged particle beam system 1000 has the following features.

The charged particle beam system 1000 has the sample holder 20 holding the functional component, the drive portions 40, 50 for moving the sample holder, and the controller 60 for controlling the drive portions 40, 50. The controller 60 controls the drive portions 40 and 50 to vibrate the sample holder 20 such that the amplitude decreases with time. Therefore, in the charged particle beam system 1000, drift of the sample holder 20 can be suppressed. Accordingly, the charged particle beam system 1000 allows for prolonged shooting times. The spatial resolution and the S/N of electron microscope images and electron diffraction patterns can be improved. Furthermore, the charged particle beam system 1000 can provide increased analysis time. The spatial resolution and S/N in making analysis can be improved.

In the charged particle beam system 1000, the O-ring 30 in contact with the support portion 10 is fitted over the sample holder 20. A drive portion (such as the X drive portion 40) moves the sample holder 20 along a first axis (such as the X-axis). The controller 60 controls the drive portion (such as the X drive portion 40) to vibrate the sample holder 20 along the first axis. Consequently, in the charged particle beam system 1000, drift of the sample holder 20 along the first axis (such as in the direction of the X-axis) can be suppressed. Furthermore, in the charged particle beam system 1000, stress induced in the O-ring 30 can be relieved and, therefore, drift attributed to the O-ring 30 can be suppressed.

In the charged particle beam system 1000, a drive portion (such as the Y drive portion 50) moves the sample holder 20 along a second axis (such as the Y-axis) perpendicular to the first axis. The controller 60 controls the drive portion (Y drive portion 50) to vibrate the sample holder 20 along the second axis. Therefore, in the charged particle beam system 1000, drift of the sample holder 20 in the direction of the second axis (such as the direction of the Y-axis) can be suppressed.

In the charged particle beam system 1000, the controller 60 controls the drive portions 40 and 50 to vibrate the sample holder 20 about a given position and then to bring the holder to a stop at the given position. Therefore, in the charged particle beam system 1000, imaging or analysis can be performed in a desired field of view while drift is suppressed.

1.3. Modifications

Modifications of the charged particle beam system 1000 associated with the first embodiment are next described. Charged particle beam systems associated with these modifications are indicated by 1100, 1200, and 1300, respectively. Those components of these charged particle beam systems which are similar in function to their respective counterparts of the above-described charged particle beam system 1000 are indicated by the same reference numerals as in the above cited figures and a detailed description thereof is omitted.

(1) First Modification

Figure 5:
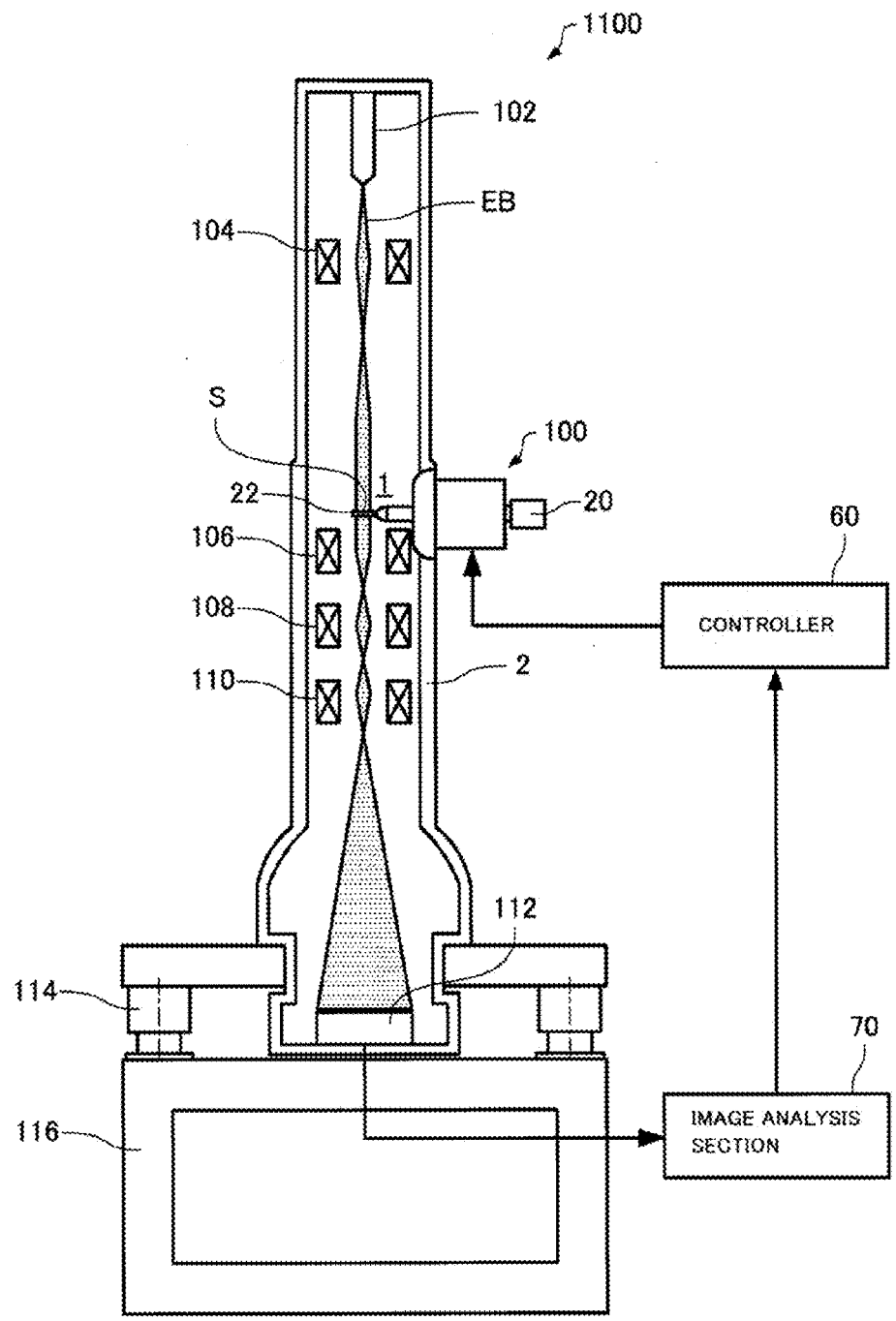
FIG. 5 is a schematic front elevation similar to FIG. 1, but showing a first modification of the first embodiment.

The charged particle beam system 1100 associated with the first modification is first described by referring to FIG. 5, which schematically shows the system 1100. In FIG. 5, for the sake of convenience, the positioning device 100 is shown in simplified form. As shown in FIG. 5, the charged particle beam system 1000 includes an image analysis section 70. The image analysis section 70 is made of dedicated circuitry and performs processing described later. The image analysis section 70 may be operated as a computer by executing control programs stored in a storage device (such as a ROM (read-only memory) or a RAM (random access memory)) using a CPU (central processing unit), and this computer may perform the processing described later.

The image analysis section 70 obtains information about the positional deviation of the sample holder 20, based on a first image indicative of an initial field of view and derived before the sample holder 20 is vibrated under control of the controller 60 and on a second image derived after the sample holder is vibrated under control of the controller 60.

The first and second images are captured by the imager 112. The imager 112 outputs information about the captured first and second images. For example, the first and second images are electron microscope images of the sample S. In response to the information about the first and second images, the image analysis section 70 performs processing regarding cross-correlation between the first and second images and obtains information about the positional deviation of the sample holder 20 (sample S). The information about the positional deviation of the sample holder 20 (sample S) is indicated by the magnitude and sense of a vector connecting the position of the sample holder 20 (sample S) assumed before the sample holder 20 is vibrated under control of the controller 60 with the position of the sample holder 20 (sample S) assumed after the sample holder 20 is vibrated under control of the controller 60.

The controller 60 controls the drive portions 40 and 50 based on the information about the positional deviation of the sample holder 20 obtained by the image analysis section 70 and moves the holder 20 into the position where the first image (initial field of view) was derived.

The operation of the charged particle beam system 1100 associated with the first modification is next described. An operation for suppressing drift of the sample holder 20 during imaging and observation of the sample S is described as one example of the operation of the charged particle beam system 1100 by referring to FIGS. 2 and 5. Only the differences with the above-described charged particle beam system 1000 are described; a description of similarities is omitted.

In order for a user to search for a desired field of view, the sample S is moved, for example, by operating the drive portions 40 and 50 via the controller 60 to move the sample holder 20, thus moving the sample S.

After a desired field of view has been determined, the user brings the sample holder 20 (sample S) to a stop and depresses the switch (not shown) on the positioning device 100. This causes the controller 60 to initiate a control sequence for vibrating the sample holder 20. The image analysis section 70 starts a processing sequence for obtaining information about the positional deviation of the sample holder 20.

First, the image analysis section 70 captures an image of the observed (current) field of view (initial field of view) on the sample S using the imager 112 before the sample holder 20 is vibrated under control of the controller 60, and acquires information about a first image.

The image analysis section 70 displays the first image on the display device while the sample holder 20 is being vibrated under control of the controller, 60. For example, if images captured by the imager 112 in real time are displayed on the display portion while the sample holder 20 are being vibrated under control of the controller 60, the field of view is switched quickly, producing display flicker. The image analysis section 70 prevents the display flicker by displaying the first image on the display device.

Then, the controller 60 controls the X drive portion 40 to vibrate the sample holder 20 about the initial field of view along the X-axis such that the amplitude decreases with time.

Then, the controller 60 controls the Y drive portion 50 to vibrate the sample holder 20 about the initial field of view along the Y-axis such that the amplitude decreases with time.

The image analysis section 70 then captures the image of the current field of view of the sample S used for observation by the use of the imager 112 after the sample holder 20 has been vibrated, and obtains information about a second image.

The image analysis section 70 then performs processing regarding cross-correlation between the first and second images and obtains information about the positional deviation of the sample holder 20. The image analysis section 70 terminates the present processing sequence.

The controller 60 controls the drive portions 40 and 50 on the basis of the results of computations performed by the image analysis section 70 to move the sample holder 20 (and the sample S). Consequently, the initial field of view can be resumed. The controller 60 terminates the control sequence. At this time, focusing may be done automatically using the autofocus system (not shown) of the charged particle beam system 1100.

As a result, stresses introduced in the O-ring 30 and drive portions 40, 50 can be reduced to infinitely small values. Consequently, drift can be reduced. The user is allowed to perform imaging or analysis in the desired field of view (initial field of view).

In the charged particle beam system 1100, the image analysis section 70 obtains information about the positional deviation of the sample holder 20, based on the first image obtained before the sample holder 20 is vibrated under control of the controller 60 and on the second image obtained after the sample holder 20 is vibrated under control of the controller 60. The controller 60 controls the drive portions 40 and 50 according to the information about the positional deviation of the sample holder 20 derived by the image analysis section 70 and moves the sample holder 20 into the position where the first image was taken. Therefore, in the charged particle beam system 1100, even if the sample holder 20 is vibrated under control of the controller 60, the holder 20 can be precisely returned into the position assumed prior to the vibrations. Thus, in the charged particle beam system 1100, even if the sample holder 20 is vibrated under control of the controller 60, the current field of view can be precisely returned to the initial field of view used before the holder 20 is vibrated.

(2) Second Modification

Figure 6:
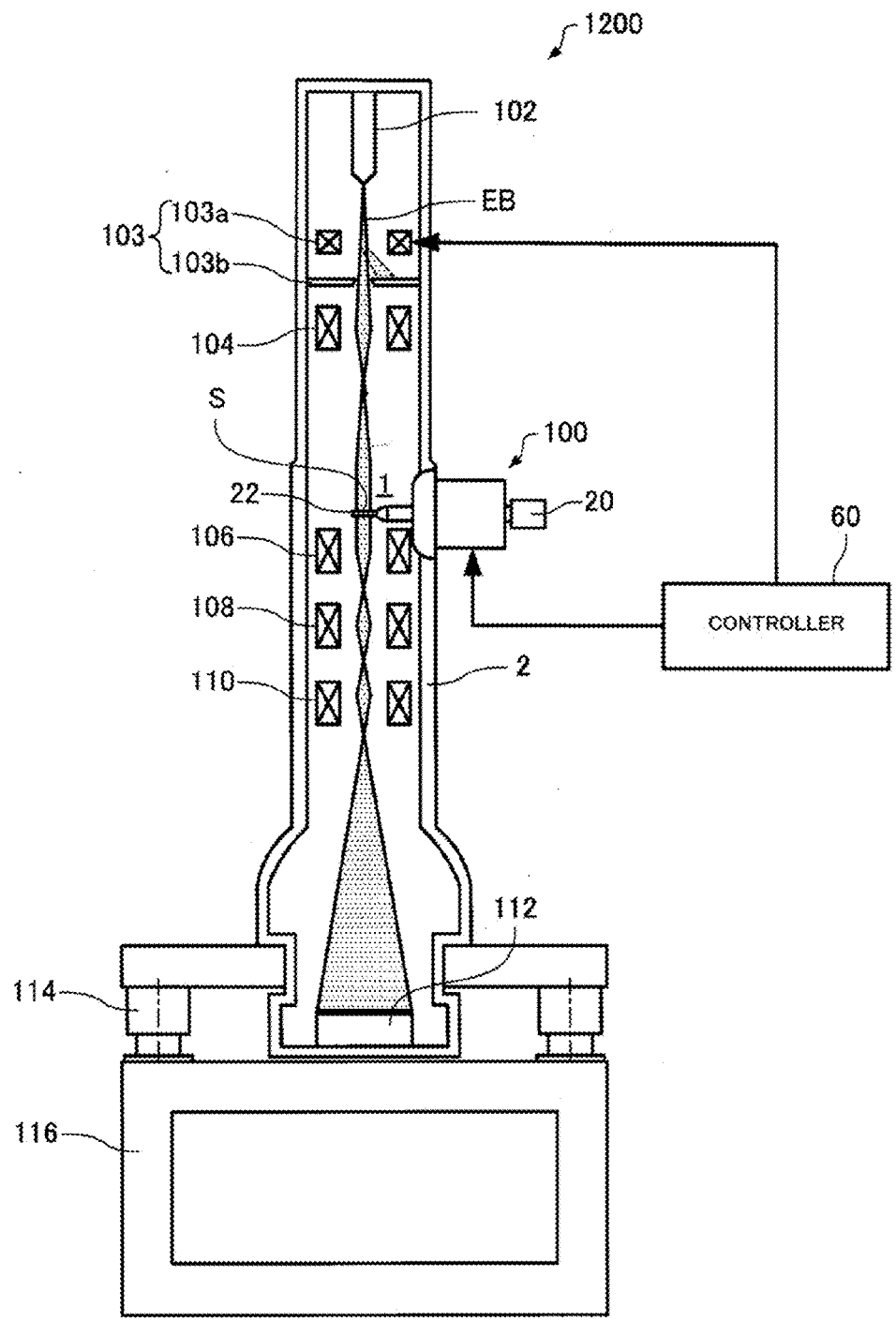
FIG. 6 is a schematic front elevation similar to FIG. 1, but showing a second modification of the first embodiment.

A charged particle beam system associated with a second modification is next described by referring to FIG. 6, where the system is generally indicated by reference numeral 1200 and schematically shown. In FIG. 6, for the sake of convenience, the positioning device 100 is shown in simplified form.

As shown in FIG. 6, the charged particle beam system 1200 includes a beam blanker 103. The beam blanker 103 is configured including a deflector 103a and an aperture 103b which are disposed between the electron beam source 102 and the condenser lenses 104 in the illustrated example. The deflector 103a deflects the electron beam EB. The deflector 103a may be either deflecting coils for deflecting the electron beam EB by producing a magnetic field or electrostatic deflecting plates for deflecting the electron beam EB by producing an electric field. The electron beam EB deflected by the deflector 103a is blocked by the aperture 103b. As a result, the electron beam EB does not travel rearwardly (downstream) of the aperture 103b.

The beam blanker 103 cuts off the electron beam EB released from the electron beam source 102 while the sample holder 20 is being vibrated under control of the controller 60. The beam blanker 103 cuts off the beam EB, for example, for a period of time between when the controller 60 starts the control sequence for vibrating the sample holder 20 and when the control sequence for vibrating the sample holder 20 is terminated.

When the control sequence for controlling the drive portions 40 and 50 to vibrate the sample holder 20 is started, the controller 60 outputs a blanking signal to operate the deflector 103a. In response to this blanking signal, the deflector 103a deflects the electron beam EB to cut off it. When the control sequence for controlling the drive portions 40 and 50 to vibrate the sample holder 20 is terminated, the controller 60 outputs an unblanking signal. In response to this signal, the deflector 103a stops the deflection of the electron beam EB and thus the beam EB passes through the aperture 103b.

In the charged particle beam system 1100, the beam blanker 103 cuts off the electron beam EB released from the electron beam source 102 while the sample holder 20 is being vibrated under control of the controller 60. This can reduce damage to the sample S due to irradiation by the beam EB.

(3) Third Modification

Figure 7:
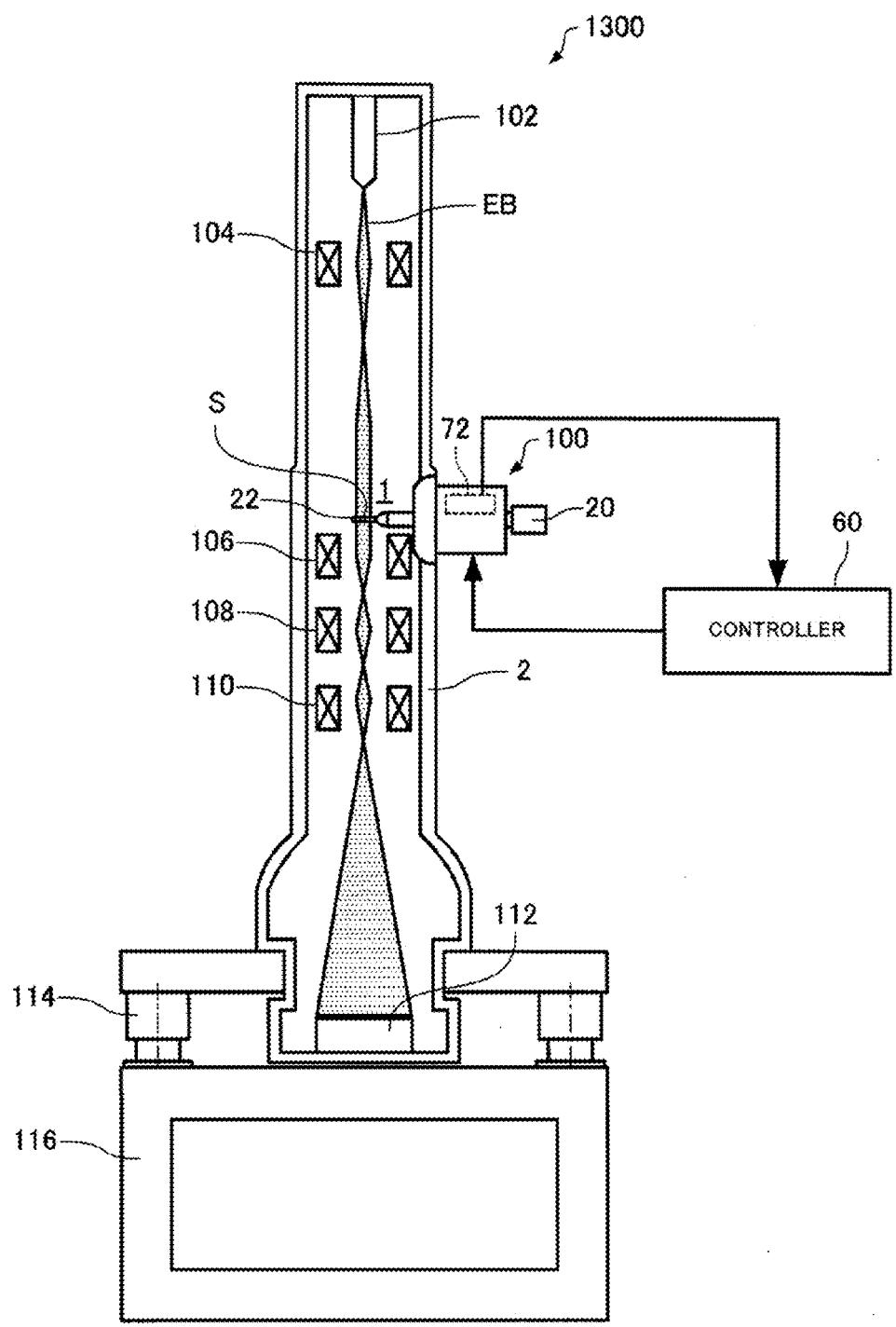
FIG. 7 is a schematic front elevation similar to FIG. 1, but showing a third modification of the first embodiment.

A charged particle beam system associated with a third modification is next described by referring to FIG. 7, where the system is generally indicated by reference numeral 1300 and schematically shown. In FIG. 7, for the sake of convenience, the positioning device 100 is shown in simplified form. As shown in FIG. 7, the charged particle beam system 1300 includes a functional component detector 72 for detecting that the sample holder 20 has been introduced in the sample chamber 1.

The functional component detector 72 is configured including a sensor (not shown) for detecting the position of the sample holder 20. The detector detects, using the sensor, that the sample holder 20 including the sample holding portion 22 has been introduced in the sample chamber 1. The sensor is positioned, for example, in the sample chamber 1 or in the hole 12 (see FIG. 2) formed in the support portion 10. If the functional component detector 72 detects that the sample holder 20 has been introduced in the sample chamber 1, the controller 60 outputs a start signal to start the control sequence for vibrating the sample holder 20.

If the functional component detector 72 has detected that the sample holder 20 has been introduced in the sample chamber 1, the controller 60 initiates the control sequence for controlling the drive portions 40 and 50 to vibrate the sample holder 20. In particular, the controller 60 starts the control sequence for vibrating the sample holder 20 in response to the start signal delivered from the functional component detector 72.

Furthermore, the controller 60 terminates the control sequence for vibrating the sample holder 20, for example, in between when the sample holder 20 is introduced into the sample chamber 1 and when the sample S is irradiated with the electron beam EB emitted from the electron beam source 102. Consequently, drift of the sample holder 20 can be suppressed efficiently.

In the charged particle beam system 1300, the functional component detector 72 detects that the sample holder 20 has been introduced in the sample chamber 1. If the functional component detector 72 has detected that the sample holder 20 has been introduced in the sample chamber 1, the controller 60 controls the drive portions 40 and 50 to vibrate the sample holder 20 such that the amplitude decreases with time. Therefore, the stress produced when the sample holder 20 is introduced into the sample chamber 1 can be relieved. Consequently, according to the charged particle beam system 1300, drift of the sample holder 20 can be suppressed.

(4) Fourth Modification

A charged particle beam system associated with a fourth modification is next described. In the above-described charged particle beam system 1000, the controller 60 sets the initial amplitude A (see FIG. 3) according to a maximum stress introduced by movement of the sample holder 20 caused by the drive portions 40 and 50.

In contrast, in the present modification, the initial amplitude A is set according to the distance traveled by the sample holder 20 in between when the sample holder 20 is introduced into the sample chamber 1 and when the control sequence for vibrating the sample holder 20 is started by the controller 60. For example, the controller 60 monitors the distance traveled by the sample holder (sample S) during a search for a desired field of view as shown in FIG. 3 and sets the initial amplitude A according to this distance.

According to this modification, the controller 60 determines the magnitude of the amplitude of the vibration according to the distance traveled by the sample holder 20. Therefore, the initial amplitude A can be set according to the introduced stress. Thus, drift of the sample holder 20 can be suppressed efficiently. According to the present modification, if the introduced stress is small, for example, the initial amplitude A can be made smaller than where the initial amplitude A is set according to the maximum stress. In consequence, drift of the sample holder 20 can be suppressed in a short time.

2. Second Embodiment

Figure 8:
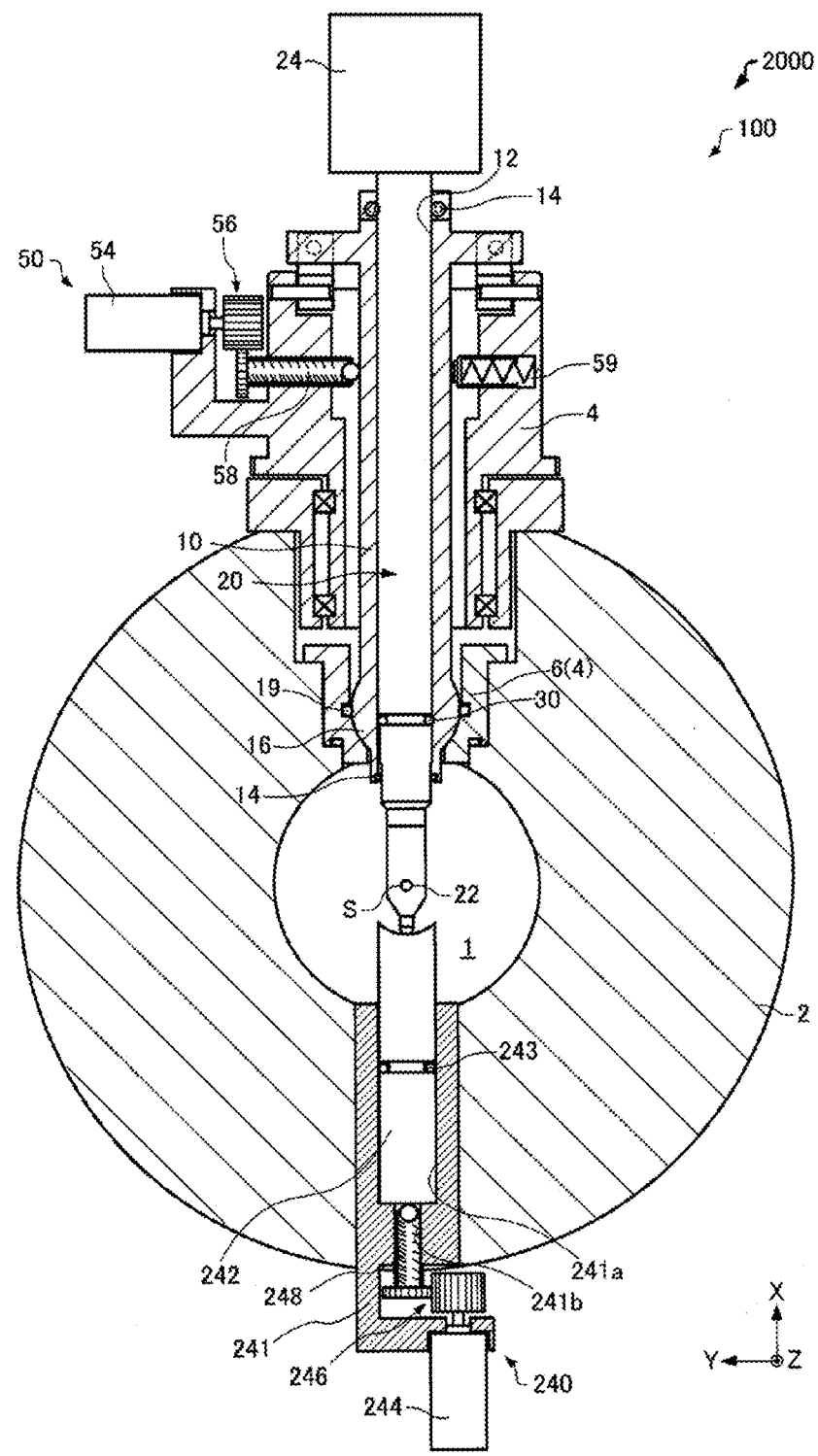
FIG. 8 is a schematic view of main portions of a charged particle beam system associated with a second embodiment of the invention.

A charged particle beam system associated with a second embodiment of the present invention is next described by referring to FIG. 8. Note that only differences with the above-described charged particle beam system 1000 are described; a description of similarities is omitted.

FIG. 8 is a view similar to FIG. 2, but schematically showing main portions of the charged particle beam system, 2000, associated with the second embodiment. Those components of the charged particle beam system 2000 associated with the second embodiment which are similar in function with their respective counterparts of the charged particle beam system 1000 associated with the first embodiment are indicated by the same reference numerals as in the above cited figures and a detailed description thereof is omitted.

In the charged particle beam system 1000 associated with the first embodiment, the X drive portion 40 moves the X feed screw 48 by rotating the X motor 44 as shown in FIG. 2. This in turn rotates the lever 42 about the shaft 43, thus moving the sample holder 20.

On the other hand, in the charged particle beam system 2000 associated with the second embodiment, the X drive portion 240 moves an X feed screw 248 by rotating an X motor 244 as shown in FIG. 8. This in turn moves a positioning slider 242 linearly, thus moving the sample holder 20.

The X drive portion 240 moves the sample holder 20 in the direction of the X-axis. The X drive portion 240 is configured including the positioning slider 242, the X motor 244, a spur gear pair 246, and the X feed screw 248.

In the charged particle beam system 2000, an X drive portion supporting block 241 is inserted in the inner wall 2. The block 241 is provided with a slider receiving hole 241a extending parallel to the X-axis. The positioning slider 242 is received in the slider receiving hole 241a so as to be movable in the direction of the X-axis. A threaded hole 241b is formed in the end of the slider receiving hole 241a that is on the atmospheric side. The X feed screw 248 is in mesh with the threaded hole 241b and extends through the threaded hole 241b.

The end of the X feed screw 248 on the positive side of the X-axis abuts against the positioning slider 242. One gear of the spur gear pair 246 is fixedly secured to the other end of the X feed screw 248 that is on the negative side of the X-axis. The other gear of the spur gear pair 246 is firmly secured to the shaft of the X motor 244. Accordingly, when the X motor 244 is rotated, the X feed screw 248 is moved linearly in the direction of the X-axis via the spur gear pair 246. This in turn moves the positioning slider 242 in the direction of the X-axis. Concomitantly, the sample holder 20 moves in the direction of the X-axis.

The positioning slider 242 prevents the sample holder 20 from being pulled in due to atmospheric pressure and supports the holder 20 in the direction of the X-axis. A conical recess is formed in the end of the positioning slider 242 on the positive side of the X-axis. A spherical portion (such as a sphere of ruby) is formed at the front end of the sample holder 20. The spherical portion abuts against the wall defining the recess of the positioning slider 242. An O-ring 243 is fitted over the positioning slider 242 and in contact with the inner surface of the X drive portion supporting block 241 to provide a hermetic seal between the supporting block 241 and the positioning slider 242.

The charged particle beam system 2000 associated with the second embodiment can yield advantageous effects similar to those produced by the charged particle beam system 1000 associated with the first embodiment. The above-described modifications of the charged particle beam system 1000 associated with the first embodiment are similarly applicable to the charged particle beam system 2000 associated with the second embodiment.

3. Third Embodiment

Figure 9:
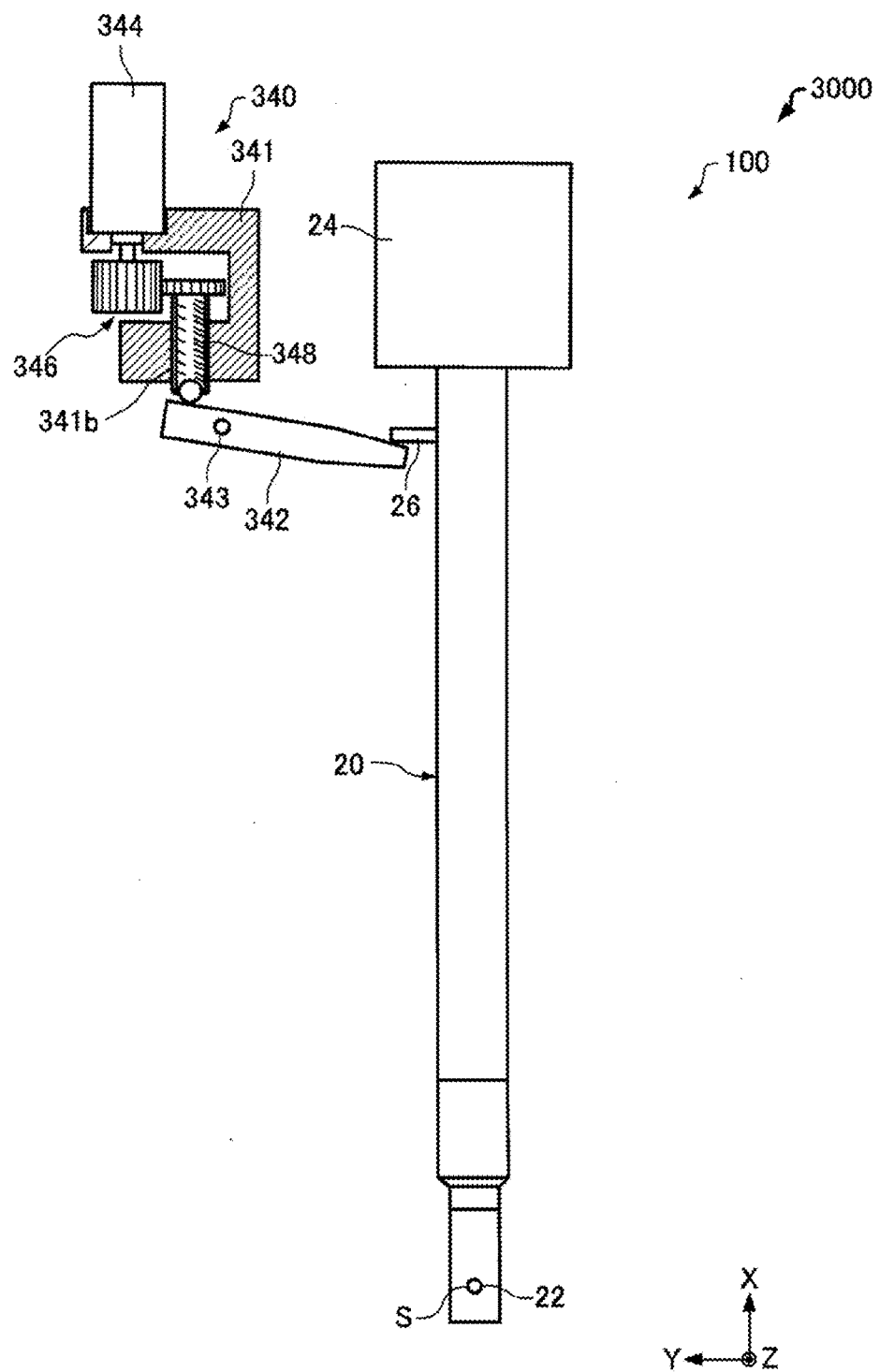
FIG. 9 is a schematic plan view, partly in cross section, of main portions of a charged particle beam system associated with a third embodiment of the invention.
Figure 10:
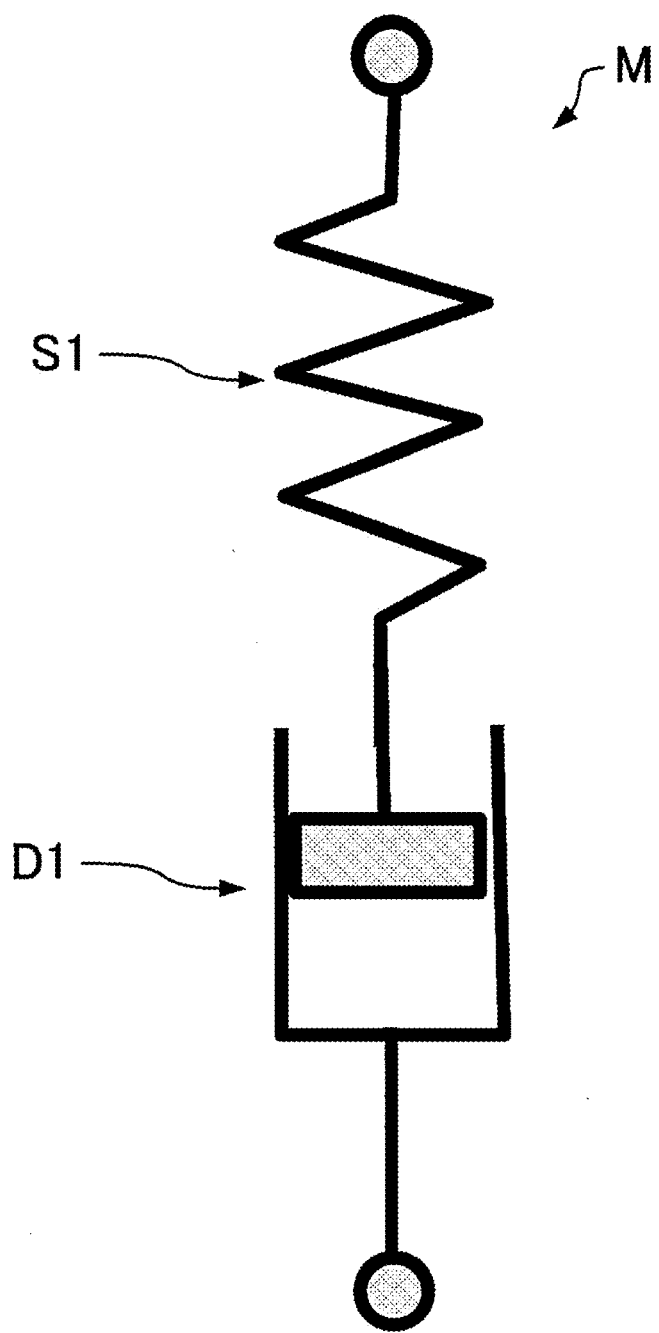
FIG. 10 is a diagram illustrating a model of drift.
Figure 11:
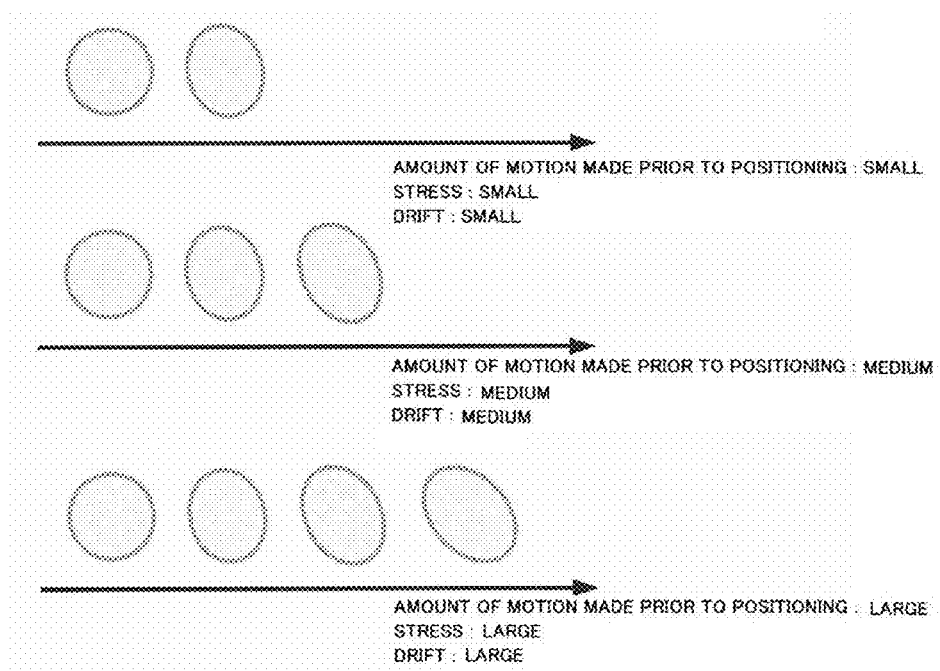
FIG. 11 is a diagram illustrating one example of damper component.
Figure 12:
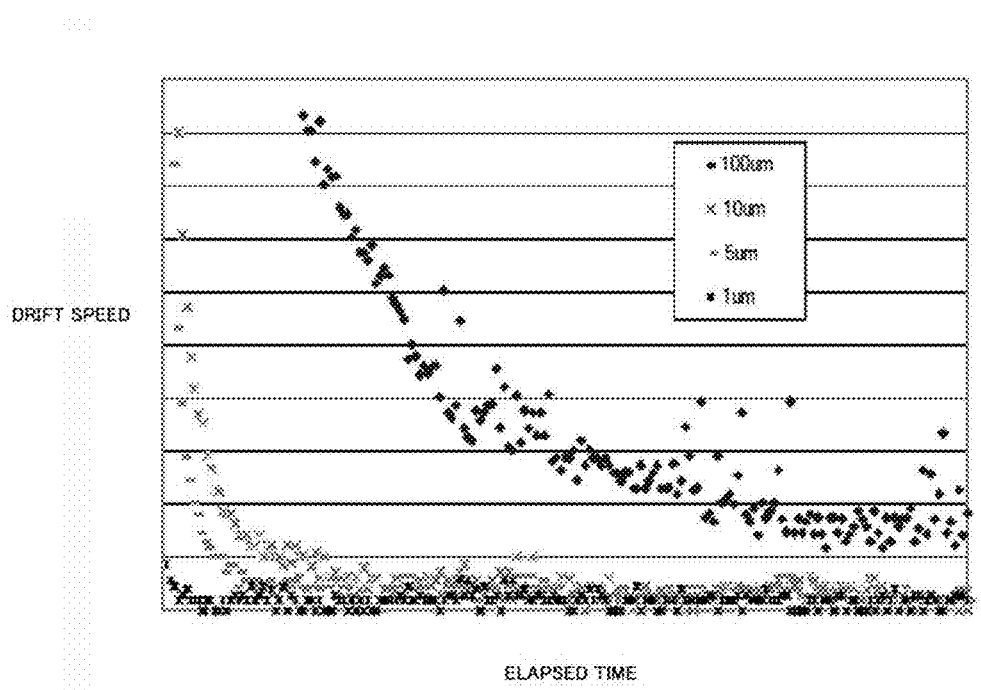
FIG. 12 is a graph in which drift speed is plotted against elapsed time for various amounts of movement made prior to positioning.

A charged particle beam system associated with a third embodiment of the present invention is next described by referring to FIG. 9. Only the differences with the above-described charged particle beam system 1000 are described; a description of similarities is omitted.

FIG. 9 is a view similar to FIG. 2, but schematically showing main portions of the charged particle beam system, 3000, associated with the third embodiment. In FIG. 9, for the sake of convenience, members other than the sample holder 20 and an X drive portion 340 are omitted from being shown. Those components of the charged particle beam system 3000 which are similar in function to their respective counterparts of the above-described charged particle beam system 1000 associated with the first embodiment are indicated by the same reference numerals as in the above cited figures and a detailed description thereof is omitted.

In the charged particle beam system 1000 associated with the first embodiment, the X drive portion 40 moves the X feed screw 48 by rotating the X motor 44 as shown in FIG. 2. This in turn rotates the lever 42 about the shaft 43, thus moving the sample holder 20.

On the other hand, in the charged particle beam system 3000 associated with the third embodiment, the X drive portion 340 moves an X feed screw 348 by rotation of an X motor 344 as shown in FIG. 9. This in turn rotates a lever 342 about a shaft 343. The sample holder 20 is moved via a protruding portion 26 formed on the sample holder 20 abutting against the lever 342.

The sample holder 20 has the protruding portion 26 protruding in a direction perpendicular to the longitudinal direction (axial direction) of the sample holder 20. When the sample holder is inserted in a hole formed in the support portion (not shown), the protruding portion 26 bears against the lever 342. In the illustrated example, the protruding portion 26 is located closer to the widened portion 24 (on the atmospheric side) in the longitudinal direction of the sample holder 20 (in the direction of the X-axis). That is, the distance between the protruding portion 26 and the widened portion 24 is smaller than the distance between the protruding portion 26 and the sample holding portion 22 in the longitudinal direction of the sample holder 20.

The X drive portion 340 moves the sample holder 20 in the direction of the X-axis. As shown in FIG. 9, the X drive portion 340 is configured including the lever 342, the X motor 344, a spur gear pair 346, and the X feed screw 348.

The lever 342 prevents the sample holder 20 from being drawn in due to atmospheric pressure and supports the sample holder 20 in the direction of the X-axis. The lever 342 is rotatable about the shaft 343. The protruding portion 26 of the sample holder 20 is in abutment with one end of the lever 342. The X feed screw 48 is in abutment with the other end of the lever 42.

The X feed screw 348 is moved linearly in the direction of the X-axis by rotation of the X motor 344. This in turn rotates the lever 342 about the shaft 343, thus moving the sample holder 20 linearly in the direction of the X-axis. The spur gear pair 346 transmits the rotation of the X motor 344 to the X feed screw 348.

The charged particle beam system 3000 has the holding member 4 (see FIG. 2) that includes an X drive portion supporting block 341. The X motor 344 is supported by the X drive portion supporting block 341 having a threaded hole 341b with which the X feed screw 348 is in mesh. The X feed screw 348 extends through the threaded hole 341b.

The charged particle beam system 3000 associated with the third embodiment can yield advantageous effects similar to those produced by the charged particle beam system 1000 associated with the first embodiment. Furthermore, the modifications of the charged particle beam system 1000 associated with the first embodiment are similarly applicable to the charged particle beam system 3000 associated with the third embodiment.

It is to be understood that the present invention is not restricted to the above embodiments but rather they can be practiced in various modified forms within the scope of the present invention. For example, in the above embodiments and modifications, the charged particle beam system is a transmission electron microscope. The charged particle beam system associated with the present invention may also be a scanning transmission electron microscope (STEM), a scanning electron microscope (SEM), a focused ion beam (FIB) system, or other instrument. Furthermore, in the charged particle beam system associated with the present invention, the charged particle beam is not restricted to an electron beam. The charged particle beam may also be an ion beam.

In addition, in the above embodiments and modifications, the functional component is a sample holder. The functional component is not restricted to this example. For example, the functional component may also be a movable aperture used as a condenser aperture, an objective aperture, or a field limiting aperture. Furthermore, the functional component may also be a phase plate whose position can be adjusted from outside of the vacuum (i.e., outside the electron optical column). The phase plate operates to vary the phase of electron waves in order to obtain a phase difference image. Additionally, the functional component may be an electron biprism wire.

The above-described embodiments and modifications are merely exemplary and the present invention is not restricted thereto. For example, the embodiments and modifications can be appropriately combined.

The present invention embraces configurations substantially identical (e.g., in function, method, and results or in purpose and advantageous effects) with the configurations described in the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

Having thus described our invention with the detail and particularity required by the Patent Laws, what is desired protected by Letters Patent is set forth in the following claims.

The invention claimed is:

1. A charged particle beam system for irradiating a sample with a charged particle beam and imaging the sample for observation thereof, said charged particle beam system having a sample positioning system comprising:
    a movable and vibratable functional component used in association with the sample positioning system;
    a mechanical drive for moving the functional component; and
    a controller for controlling the mechanical drive,
    wherein when the sample has reached a desired position the controller controls the mechanical drive to drive the functional component in reciprocal directions such that its amplitude in each direction is driven to decrease with time.

2. The charged particle beam system as set forth in claim 1, further comprising a support portion by which said functional component is movably supported.

3. The charged particle beam system as set forth in claim 2, wherein an O-ring in contact with said support portion is fitted over said functional component, wherein said mechanical drive moves the functional component along a first axis, and
wherein said controller controls the mechanical drive to drive the functional component along the first axis.

4. The charged particle beam system as set forth in claim 3, wherein said functional component is supported by said support portion such that a longitudinal direction of the functional component is parallel to said first axis.

5. The charged particle beam system as set forth in claim 3, wherein said mechanical drive is further operative to move said functional component along a second axis perpendicular to said first axis, and wherein said controller controls the mechanical drive to drive the functional component along the second axis.

6. The charged particle beam system as set forth in claim 1, wherein said controller controls said mechanical drive such that said functional component is driven about a given position and then brought to a stop at the given position.

7. The charged particle beam system as set forth in claim 1, wherein said functional component is a sample holder that holds said sample.

8. The charged particle beam system as set forth in claim 7, wherein said controller includes an image analysis section for obtaining information about positional deviation of said functional component, based on a first image obtained before the functional component is vibrated under control of the controller and on a second image obtained after the functional component is vibrated under control of the controller, and wherein said controller controls said mechanical drive based on the information about the positional deviation of the functional component obtained by the image analysis section to move the functional component into the position where the first image was obtained.

9. The charged particle beam system as set forth in claim 1, further comprising:
a charged particle beam source producing said charged particle beam; and
a beam blanker for cutting off the charged particle beam emitted from the charged particle beam source while the functional component is being vibrated under control of the controller.

10. The charged particle beam system as set forth in claim 1, wherein there is further provided a functional component detector for detecting that the functional component has been introduced in a sample chamber, and wherein, when the functional component detector has detected that the functional component has been introduced in the sample chamber, said controller controls said mechanical drive to drive the functional component such that its amplitude decreases with time.

11. A charged particle beam system as set forth in claim 1, wherein said controller determines the magnitude of the amplitude of the reciprocal movement of said functional component according to a distance traveled by the functional component.

* * * * *